United States Patent [19]
Manabe et al.

[11] Patent Number: 5,905,276
[45] Date of Patent: *May 18, 1999

[54] LIGHT EMITTING SEMICONDUCTOR DEVICE USING NITROGEN-GROUP III COMPOUND

[75] Inventors: Katsuhide Manabe; Masahiro Kotaki; Hisaki Kato; Michinari Sassa, all of Nakashima-gun; Isamu Akasaki, 38-805, 1-ban, Joshin 1-Chome, Nishi-ku, Nagoya-shi, Aichi-ken, 451; Hiroshi Amano, 25-505, Nijigaokahigashidanchi, 21, Kamioka-cho, 2-Chome, Meito-ku, Nagoya-shi, Aichi-ken, 465, all of Japan

[73] Assignees: Isamu Akasaki; Hiroshi Amano; Toyoda Gosei Co., Ltd., Aichi-ken, all of Japan

[*] Notice: This patent issued on a continued prosecution application filed under 37 CFR 1.53(d), and is subject to the twenty year patent term provisions of 35 U.S.C. 154(a)(2).

[21] Appl. No.: 08/968,896

[22] Filed: Nov. 6, 1997

Related U.S. Application Data

[63] Continuation of application No. 08/141,963, Oct. 28, 1993, abandoned.

[30] Foreign Application Priority Data

Oct. 29, 1992 [JP] Japan ..................................... 4-316598

[51] Int. Cl.[6] ..................................................... H01L 33/00
[52] U.S. Cl. .............................................................. 257/103
[58] Field of Search ........................................... 257/103

[56] References Cited

U.S. PATENT DOCUMENTS

| | | | |
|---|---|---|---|
| 4,268,842 | 5/1981 | Jacob et al. ................................ | 357/17 |
| 4,473,938 | 10/1984 | Kobayashi et al. .................... | 29/569 L |
| 4,855,249 | 8/1989 | Akasaki et al. ........................... | 437/81 |
| 4,911,102 | 3/1990 | Manabe et al. ........................... | 118/719 |
| 4,946,548 | 8/1990 | Kotaki et al. ........................... | 156/643 |
| 5,122,845 | 6/1992 | Manabe et al. ............................. | 357/17 |
| 5,146,465 | 9/1992 | Khan et al. ............................... | 372/45 |
| 5,205,905 | 4/1993 | Kotaki et al. ........................... | 156/662 |
| 5,237,182 | 8/1993 | Kitagawa et al. ....................... | 257/103 |
| 5,247,533 | 9/1993 | Okazaki et al. .......................... | 372/45 |
| 5,281,830 | 1/1994 | Kotaki et al. ........................... | 257/103 |
| 5,369,289 | 11/1994 | Tamaki et al. ............................. | 257/94 |

FOREIGN PATENT DOCUMENTS

| | | |
|---|---|---|
| 59-228776 | 12/1984 | Japan . |
| 60-173829 | 9/1985 | Japan . |
| 1-17484 | 1/1989 | Japan . |
| 2-257677 | 10/1990 | Japan . |
| 2257678 | 10/1990 | Japan . |
| 2257679 | 10/1990 | Japan . |
| 4-10665 | 1/1992 | Japan . |
| 4-321280 | 11/1992 | Japan . |

OTHER PUBLICATIONS

H. Amano et al; "P–Type Conduction in Mg–Doped GaN Treated with Low–Energy Electron Beam Irradiation (LEEBI)", Journal of Japanese Applied Physics, vol. 28, No. 12, Dec. 1989, pp. L2112–L2114.

*Primary Examiner*—Stephen D. Meier
*Attorney, Agent, or Firm*—Pillsbury Madison & Sutro LLP

[57] ABSTRACT

Disclosed is a light-emitting semiconductor device which comprises an N-layer of N-type nitrogen-Group III compound semiconductor satisfying the formula $Al_xGa_yIn_{1-x-y}N$, inclusive of x=0, y=0 and x=y=0, a P-layer of P-type nitrogen-Group III compound semiconductor satisfying the formula $Al_xGa_yIn_{1-x-y}N$, inclusive of x=0, y=0 and x=y=0 and a Zn doped semi-insulating I-layer of nitrogen-Group III compound semiconductor satisfying the formula $Al_xGa_yIn_{1-x-y}N$, inclusive of x=0, y=0 and x=y=0. The semi-insulating I-layer has a 20 to 3000 Å thickness and can emit light in the range of 485 to 490 nm. By employing the I-layer, the light-emitting diode as a whole can emit light in the range of 450 to 480 nm.

11 Claims, 9 Drawing Sheets

F I G. 1
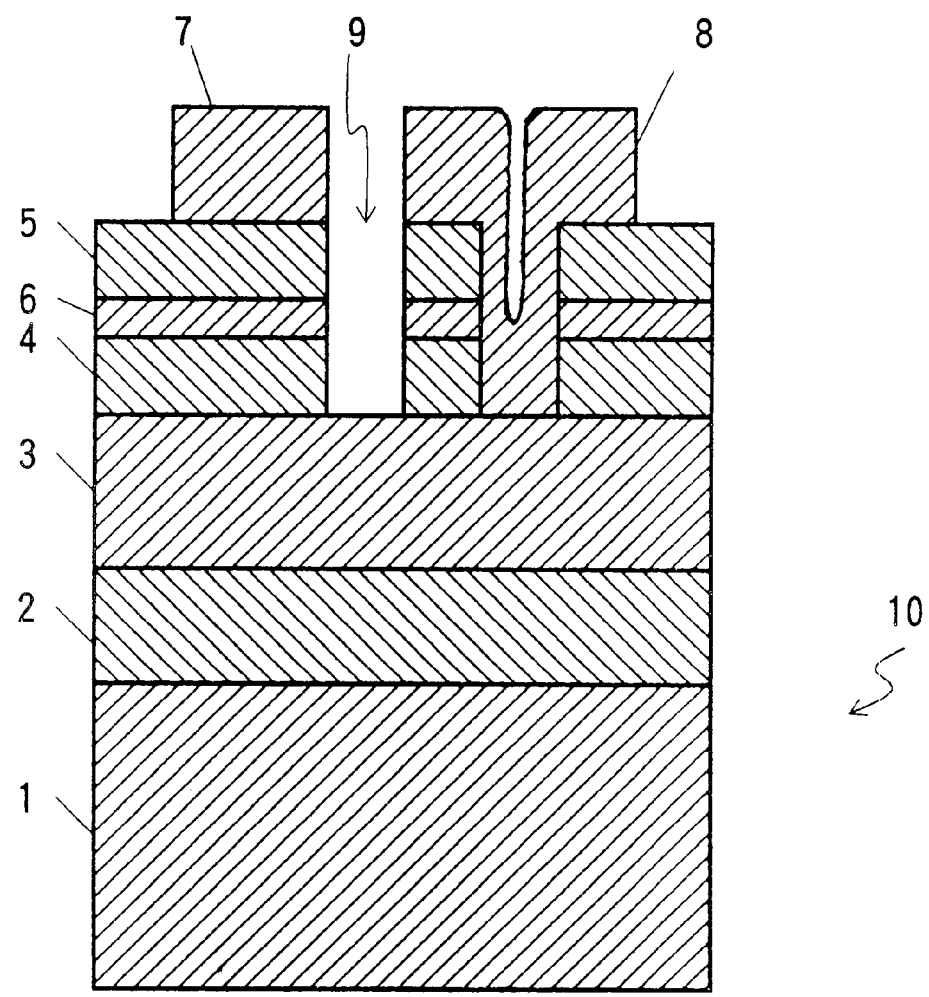

F I G. 8
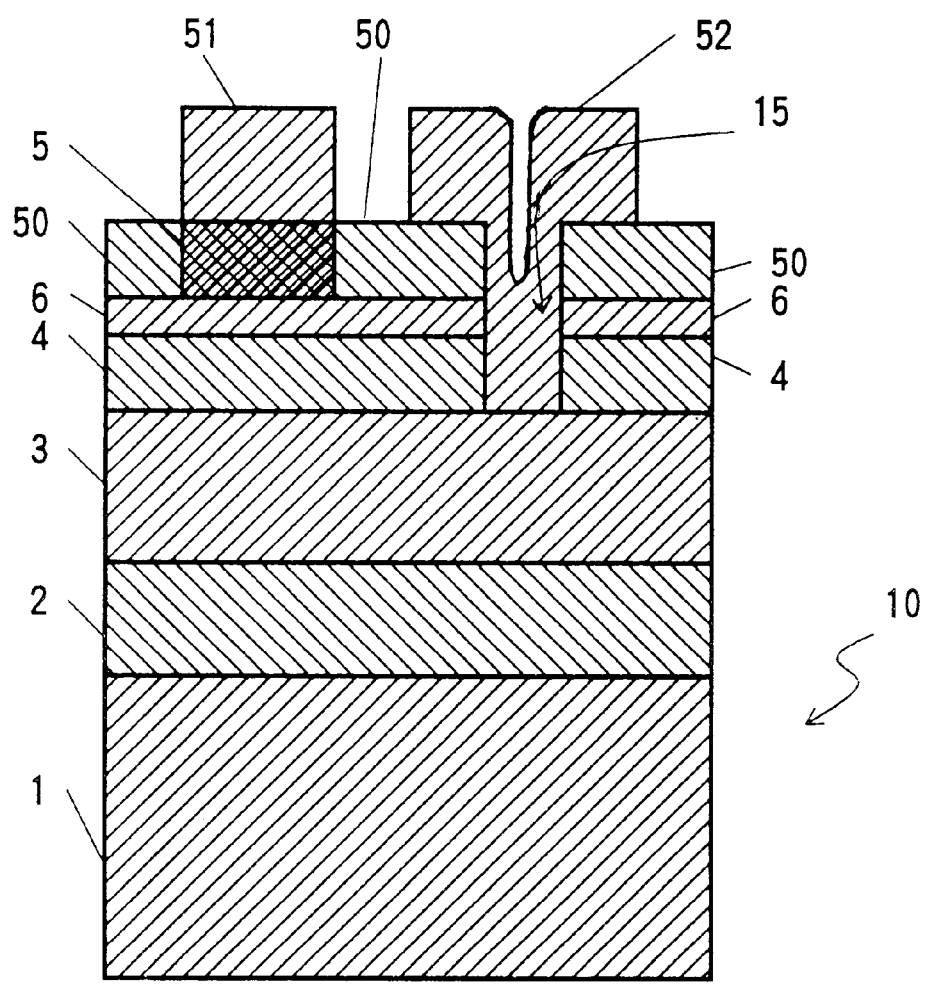

5,905,276

LIGHT EMITTING SEMICONDUCTOR DEVICE USING NITROGEN-GROUP III COMPOUND

RELATED APPLICATIONS

This is a continuation of application Ser. No. 08/141,963, filed on Oct. 28, 1993 now abandoned.

This application corresponds to Japanese patent application 316,598/1992, filed on Oct. 29, 1992 and incorporated herein by reference.

BACKGROUND OF THE INVENTION

1. Field of the Invention

The present invention relates to a light-emitting semiconductor device that emits blue light and uses a nitrogen-Group III compound.

2. Description of the Prior Art

It has been known that a GaN compound semiconductor may be used to obtain a light-emitting diode (LED) which emits blue light. This semiconductor device is useful because of its high luminous efficiency resulting from direct electron transition and because of its ability to emit blue light, which is one of the three primary colors.

Recently, it has been found that doping Mg as an impurity and irradiating electrons into a GaN layer can change it into a GaN layer of p-type. As a result, the use of a GaN light-emitting diode with a PN junction instead of a junction of an N-layer and a semi-insulating I-layer is being suggested There exists, however, a problem of wavelength with the above device. The wavelength of light from such an LED with a PN junction is about 430 nm, or shorter than that of blue light.

SUMMARY OF THE INVENTION

It is an object of the present invention to make a spectrum of the light emitted from a nitrogen-Group III compound semiconductor satisfying the formula $Al_xGa_yIn_{1-x-y}N$, inclusive of x=0, y=0 and x=y=0, closer to that of blue light.

The novel feature of the present invention resides in a light-emitting semiconductor device comprising an N-layer of an N-type nitrogen-Group III compound semiconductor satisfying the formula $Al_xGa_yIn_{1-x-y}N$, inclusive of x=0, y=0 and x=y=0, a P-layer of a P-type nitrogen-Group III compound semiconductor satisfying the formula $Al_xGa_yIn_{1-x-y}N$, inclusive of x=0, y=0 and x=y=0 and a Zn doped semi-insulating I-layer of a nitrogen-Group III semiconductor satisfying the formula $Al_xGa_yIn_{1-x-y}N$, inclusive of x=0, y=0 and x=y=0, formed between the N-layer and the P-layer.

According to the present invention, the semi-insulating layer preferably has a thickness of 20 to 3000 Å and preferably contains Zn impurities in a concentration of about $1\times10^{19}/cm^3$ to $1\times10^{21}/cm^3$. It is not desirable that the I-layer thickness be less than 20 Å, since the semi-insulating I-layer has less luminance. It is not desirable that the I-layer thickness be greater than 3000 Å, since the concentration of electrons injected into the P-layer becomes lower. It is not desirable that the impurity concentration of Zn impurities be higher than $1\times10^{21}/cm^3$, since poor quality crystallization occurs as a result. It is not desirable that the impurity concentration of Zn be lower than $1\times10^{19}/cm^3$, since the luminous intensity of the light-emitting diode decreases as a result.

When a voltage was applied to the diode in order to make a potential of the P-layer positive relative to that of the N-layer, an emission with a peak wavelength of 492 nm was observed from the junction between the N-layer and the I-layer and from the I-layer, and an emission with a peak wavelength of 430 nm was observed from the junction between the I-layer and the P-layer. By way of the present invention, it is possible to increase long wavelength components as a whole and increase the luminous intensity of blue light from an LED.

BRIEF DESCRIPTION OF THE DRAWINGS

In the accompanying drawings:

FIG. 1 is a diagram showing the structure of the LED embodied in Example 1;

FIG. 8 is a diagram showing the structure of the LED embodied in Example 2; and

DETAILED DESCRIPTION OF THE INVENTION

Figure 2:
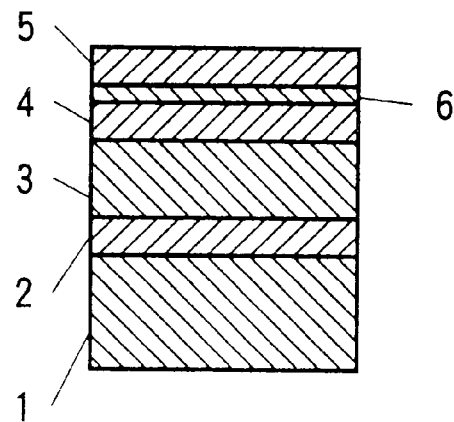
FIG. 2 through 7 are sectional views illustrating successive steps of producing the LED embodied in Example 1.

The invention will be more fully understood by reference to the following examples.

EXAMPLE 1

FIG. 1 shows an LED 10 which has a sapphire substrate 1 which has five layers consecutively formed thereon: a 500 Å thick AlN buffer layer 2, a 2.2 μm thick GaN N⁺-layer 3 of high carrier (N-type) concentration, a 1.5 μm thick GaN N-layer 4 of low carrier (N-type) concentration, an about 400 Å thick GaN I-layer 6, and an 0.2 μm thick P-layer 5. Aluminum electrodes 7 and 8 are connected to the P-layer 5 and the N⁺-layer 3 of high carrier concentration, respectively. They are electrically insulated by a groove 9.

The LED 10 was produced by gaseous phase growth, called metal organic vapor phase epitaxy. This process is referred to as MOVPE hereinafter.

The gases employed in this process were $NH_3$, a carrier gas ($H_2$), trimethyl gallium ($Ga(CH_3)_3$) (THG hereinafter), trimethyl aluminum ($Al(CH_3)_3$) (TMA hereinafter), silane ($SiH_4$), biscyclopentadienyl magnesium ($Mg(C_5H_5)_2$) ($CP_2Mg$ hereinafter) and diethylzinc (DEZ hereinafter).

The monocrystalline sapphire substrate 1, whose main surface 'a' was cleaned by organic washing solvent and heat treatment, was placed on a susceptor in a reaction chamber for the MOVPE treatment. Then the sapphire substrate 1 was etched at 1100° C. by a vapor of $H_2$ fed into the chamber at a flow rate of 2 liter/min. under normal pressure.

On the sapphire substrate 1, the 500 Å thick AlN buffer layer 2 was formed under conditions of lowering the temperature in the chamber to 400° C., keeping it constant and supplying $H_2$, $NH_3$ and TMA at a flow rate of 20 liter/min., 10 liter/min. and $1.8\times10^{-5}$ mol/min. respectively. On the buffer layer 2, about a 2.2 μm thick GaN N⁺-layer 3 of high carrier concentration with electron concentration of $1.5\times10^{18}/cm^3$ was formed under conditions of keeping the temperature of the sapphire substrate 1 at 1150° C. and supplying $H_2$, $NH_3$, TMG and silane diluted to 0.86 ppm by $H_2$ for thirty minutes at a flow rate of 20 liter/min., 10 liter/min., $17\times10^{-4}$ mol/min. and 200 ml/min. respectively On the N⁺-layer 3, an about 1.5 μm thick GaN N-layer 4 of low carrier concentration with electron concentration of $1\times10^{15}/cm^3$ was formed under conditions of keeping the temperature of the sapphire substrate 1 at 1150° C. and supplying $H_2$, $NH_3$ and TMG for twenty minutes at a flow rate of 20 liter/min., 10 liter/min., and $1.7\times10^{-4}$ mol/min. respectively.

On the N-layer 4, a 400 Å thick GaN I-layer 6 with Zn concentration of $3\times10^{20}/cm^3$ was formed under conditions of keeping the temperature of the sapphire trate 1 at 900° C. and supplying $H_2$, $NH_3$, TG and DEZ for thirty seconds at a flow rate of 20 liter/min., 10 liter/min., $1.7\times10^{-4}$ mol/min. and $1.5\times10^{-4}$ mol/min. respectively.

On the I-layer 6, a 0.2 µm thick GaN I-layer 5 was formed under conditions of keeping the temperature of the sapphire substrate 1 at 900° C. and supplying $H_2$, $NH_3$, TMG and $CP_2Mg$ for three minutes at a flow rate of 20 liter/min., 10 liter/min., $1.7\times10^{-4}$ mol/min. and $2\times10^{-7}$ mol/min. respectively. The I-layer 5 remained insulative.

Then, a P-layer 5 of P-type conduction was produced as described below. Electron rays were uniformly irradiated into the I-layer 5 using a reflective electron beam diffraction device. The conditions of the irradiation were set at 10 kv of accelerating voltage, 1 µA of sample current, 0.2 mm/sec. of speed for beam scanning 60 µmφ of beam aperture and $2.1\times10^{-5}$ Torr of vacuum. This irradiation changed the insulative I-layer 5 with resistivity of $10^8$ Ω·cm or more into a P-type conductive semiconductor with resistivity of 40 Ω·cm.

Thereby, a wafer of multi structural layers was obtained as shown in FIG. 2.

The following FIGS. 3 to 7 show sectional views of an element on the wafer.

Figure 3:
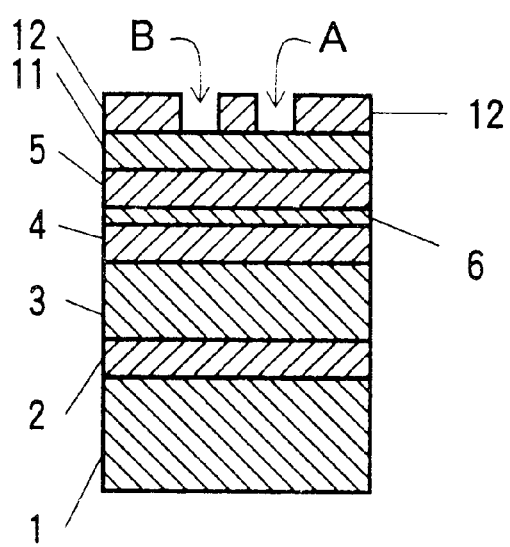

A 2000 Å thick $SiO_2$ layer 11 was formed on the P-layer 5 by sputtering as shown in FIG. 3. The $SiO_2$ layer 11 was coated with a photoresist layer 12. Two selected parts of the photoresist, named A and B, were removed from the P-layer 5 by photolithograph. The electrode forming part A corresponds to a place where a hole 15 (shown in FIGS. 5 and 6) is formed reaching the $N^+$-layer 3 of high carrier concentration. The part B corresponds to a place where a groove 9 (also shown in FIGS. 5 and 6) is formed for insulating the part A from an electrode of the P-layer 5.

Figure 4:
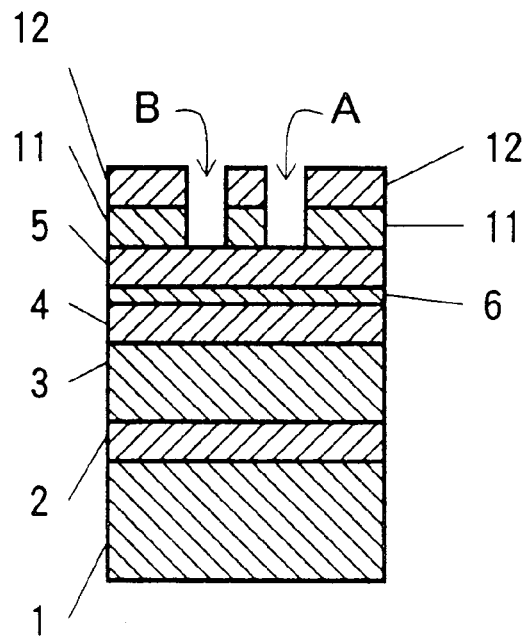
Figure 5:
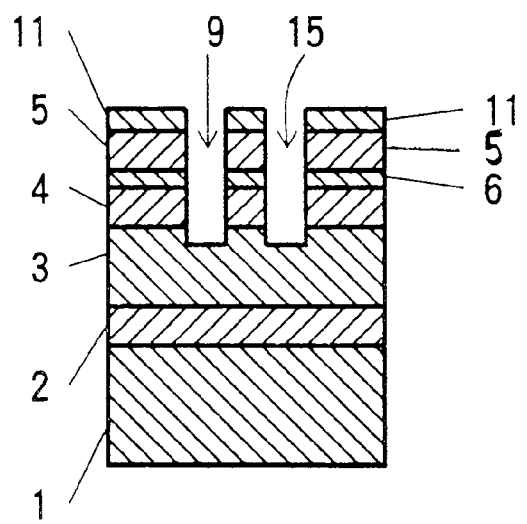

The parts of the $SiO_2$ layer 11 not covered by photoresist 12 were etched off by an etching liquid such as hydrofluoric acid as shown in FIG. 4. Then the exposed part of the following successive four layers from the surface of the device, the P-layer 5, the I-layer 6, the N-layer 4 of low carrier concentration and the upper part of the $N^+$-layer 3 of high carrier concentration, were removed by dry etching, or supplying a high-frequency power density of 0.44 W/cm² and $BCl_3$ gas of 10 ml/min. at a vacuum degree of 0.04 Torr as shown in FIG. 5. After that, dry etching with Ar was carried out on the device. Thus, both the hole 15 for an electrode reaching the $N^+$-layer 3 of high carrier concentration and the groove 9 to insulate the part A from an electrode of the P-layer 5 were formed.

Figure 6:
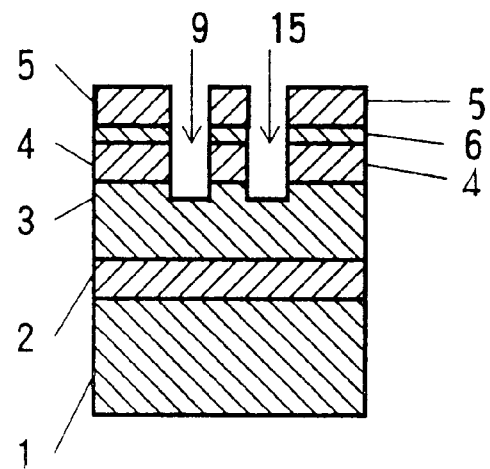
Figure 7:
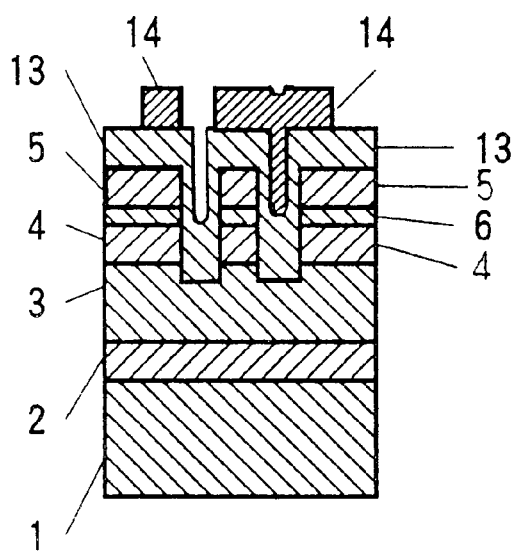

The $SiO_2$ layer 11 remaining on the P-layer 5 was removed by hydrofluoric acid as shown in FIG. 6. An Al-layer 13 was laminated on the entire surface of the device by vapor deposition as shown in FIG. 7. Thus, the Al-layer 13 electrically contacting the $N^+$-layer 3 of high carrier concentration in the hole 15 was formed. Then, photoresist 14 was laminated on the Al layer 13. It was etched off by photolithography leaving patterns of the configuration for two electrodes connected to the $N^+$-layer 3 of high carrier concentration and the P-layer 5, respectively.

The exposed part of the Al layer 13, not covered by the photoresist 14 as a mask, was etched off by an etching liquid such as nitric acid. At this time, the Al layer 13 deposited in the groove 9 was completely removed for insulation. After the photoresist 14 was completely removed by photoresist removal liquid, two electrodes, the electrode 8 for the $N^+$-layer 3 of high carrier concentration and the electrode 7 for the P-layer 5 were formed. A wafer treated with above-mentioned process was divided into each element which shows a gallium nitride light-emitting diode with PN structure as shown in FIG. 1.

The obtained LED 10 was found to have a luminous intensity of 10 mcd and a wavelength of 460 to 470 nm. In contrast to a conventional LED, the one in the present invention has an emission spectrum shifted toward the long end by 20 to 50 nm and emits blue light.

Alternatively, methyl biscyclopentadienyl magnesium ($Mg(C_6H_7)_2$) may be used to supply Mg. Although Example 1 used a double structural N-layer comprising $N^+$-layer 3 of high carrier concentration and N-layer 4 of low carrier concentration, a single structural N-layer may be used as an alternate.

An LED with a double structural N-layer is brighter than a similar LED with a single structural N-layer. The desirable electron concentration and thickness of two kinds of layers for the double structure are described in the next two paragraphs.

The N-layer 4 of low carrier concentration preferably contains an electron concentration of $1\times10^{14}/cm^3$ to $1\times10^{17}/cm^3$ and has a thickness of 0.5 to 2 µm. It is not desirable that the electron concentration of the N-layer 4 be greater than $1\times10^{17}/cm^3$ since the luminous intensity of the LED is thereby decreased. It is not desirable that the electron concentration of the N-layer be lower than $1\times10^{14}/cm^3$, since the serial resistance of the LED is thereby heightened and heat is thus radiated. It is not desirable that the N-layer thickness be greater than 2 µm, since the serial resistance of the LED is thereby heightened and heat is thus radiated. It is not desirable that the N-layer thickness be smaller than 0.5 µm, since the luminous intensity of the LED is thereby decreased.

The $N^+$-layer 3 of high carrier concentration preferably contains an electron concentration of $1\times10^{17}/cm^3$ to $1\times10^{19}/cm^3$ and has a thickness of 2 to 10 µm. It is not desirable that the electron concentration of the $N^+$-layer 4 be greater than $1\times10^{19}/cm^3$ since the resultant LED has poor crystalline quality. It is not desirable that the electron concentration of the $N^+$-layer be lower than $1\times10^{17}/cm^3$, since the serial resistance of the LED is thereby heightened and heat is thus radiated. It is not desirable that the N-layer thickness be greater than 10 µm since the sapphire substrate of the LED is thereby bent. It is not desirable that the $N^+$-layer thickness be smaller than 2 µm, since the serial resistance of the LED is thereby heightened and heat is thus radiated.

EXAMPLE 2

FIG. 8 shows an LED 10 which has a sapphire substrate 1 which has five layers consecutively formed thereon: a 500 Å thick AlN buffer layer 2, a 2.2 µm thick GaN $N^+$-layer 3 of high carrier concentrations a 1.5 µm thick GaN N-layer 4 of low carrier concentration, an about 400 Å thick GaN I-layer 6, and an 0.2 µm thick GaN I-layer 50. The I-layer 50 has a P-layer 5 of P-type in a specific position therein.

A hole 15, reaching the $N^+$-layer 3 of high carrier concentration, is formed through three layers, the I-layer 50, the I-layer 6 and the N-layer 4 of low carrier concentration, from the surface of the I-layer 50. An aluminum electrode 52, reaching the $N^+$-layer 3 of high carrier concentration, is formed on the I-layer 50 through the hole 150 Another aluminum electrode 51 is formed on the P-layer 5 and contacts it. The electrode 52 for the N$^+$-layer 3 of high carrier concentration is electrically insulated from the P-layer 5 by the I-layer 50.

FIG. 9 to 15 show sectional views of an element on a wafer. In practice, elements consecutively formed thereby are divided into individual elements after the following processes are carried out to form the structure shown in FIG. 8.

Figure 9:
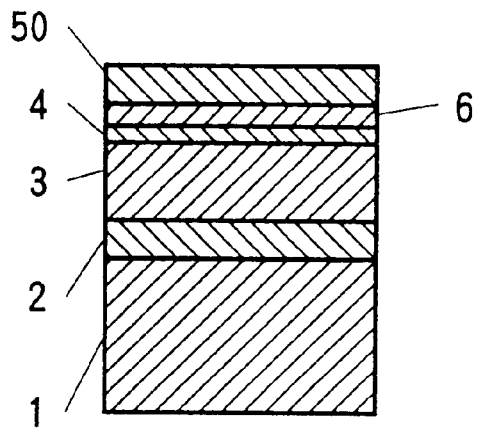
FIG. 9 to 15 are sectional views illustrating successive steps of producing the LED embodied in Example 2.
Figure 10:
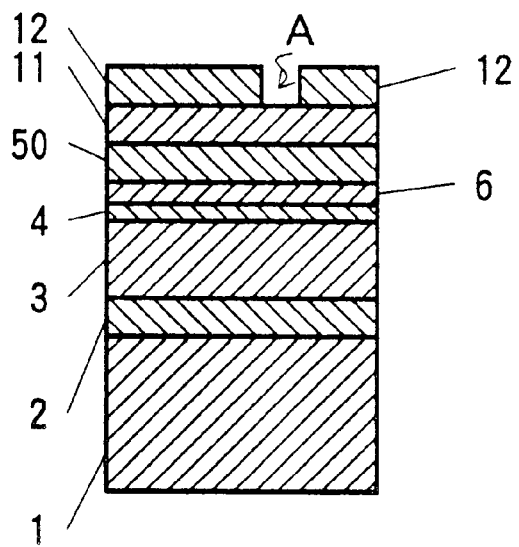

A wafer, shown in FIG. 9, is produced in the same manner as the wafer of Example 1. On the GaN I-layer 50, a 2000 Å thick SiO$_2$ layer 11 was formed by sputtering as shown in FIG. 10. A photoresist layer 12 was laminated on the SiO$_2$ layer 11. A selected part, named A, of photoresist was removed by photolithography. The part A will form a hole 15 reaching the N$^+$-layer 3 on the I-layer 50.

Figure 11:
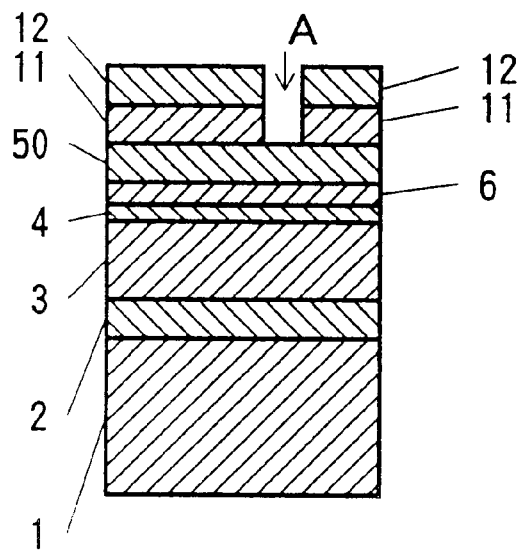
Figure 12:
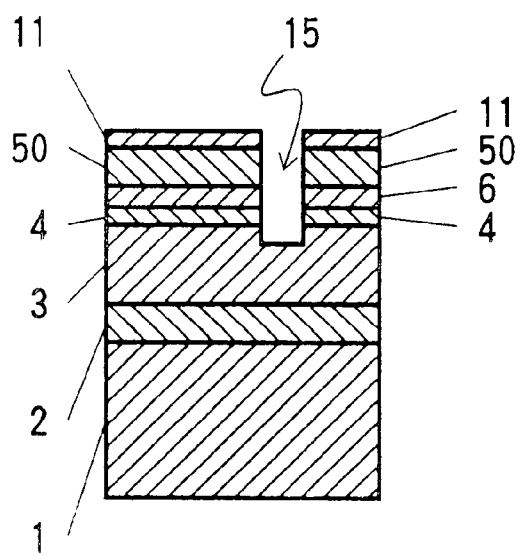
Figure 13:
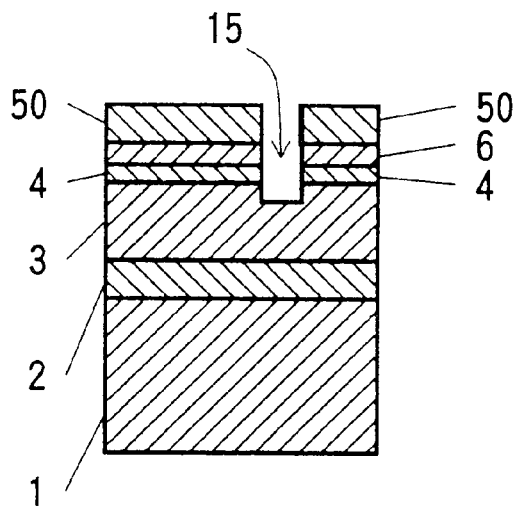
Figure 14:
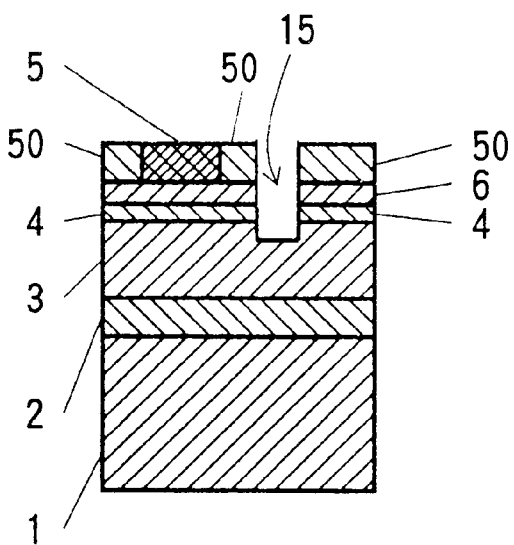

The SiO$_2$ layer 11 not covered by photoresist layer 12 was etched off by an etching liquid such as hydrofluoric acid as shown in FIG. 11. Then the exposed part of the following successive four layers from the surface of the device, the I-layer 50, the I-layer 6, the N-layer 4 of low carrier concentration and the upper part of N$^+$-layer 3, were removed by dry etching supplying a high-frequency power density of 0.44 W/CM$^2$ and BCl$_3$ gas of 10 ml/min. at a vacuum degree of 0.04 Torr as shown in FIG. 12. After that, dry etching with Ar was carried out on the device. Thereby, the hole 15 for the electrode 52 reaching the N$^+$-layer 3 of high carrier concentration was formed. Then the portion of SiO$_2$ layer 11 remaining on the I-layer 50 was removed by hydrofluoric acid as shown in FIG. 13.

The P-type part 5 made of P-type semiconductor was produced by uniform irradiation of electron rays into the selected part of the I-layer 50 using a reflective electron beam diffraction device. The conditions of the irradiation were set at 10 kv of accelerating voltage, 1 $\mu$A of sample currents 0.2 mm/sec of speed for beam scanning, 60 $\mu$m$\phi$ of beam aperture and 2.1×10$^{-5}$ Torr of vacuum degree. This irradiation changed the irradiated part of the insulative I-layer 5 having a resistivity of 10$^8$ Ω·cm or more into a P-type semiconductor having a resistivity of 35 Ω·cm. At this time, the remaining parts of the I-layer 50 where electron rays were not irradiated remained insulative. Thus, the P-type part 5 vertically formed a PN junction with the N-layer 4 of low carrier concentration by sandwiching a thin I-layer 6 between the P-layer 5 and the N-layer 4. Horizontally, the P-type part 5 was electrically insulated from its surroundings by the I-layer 50.

Figure 15:
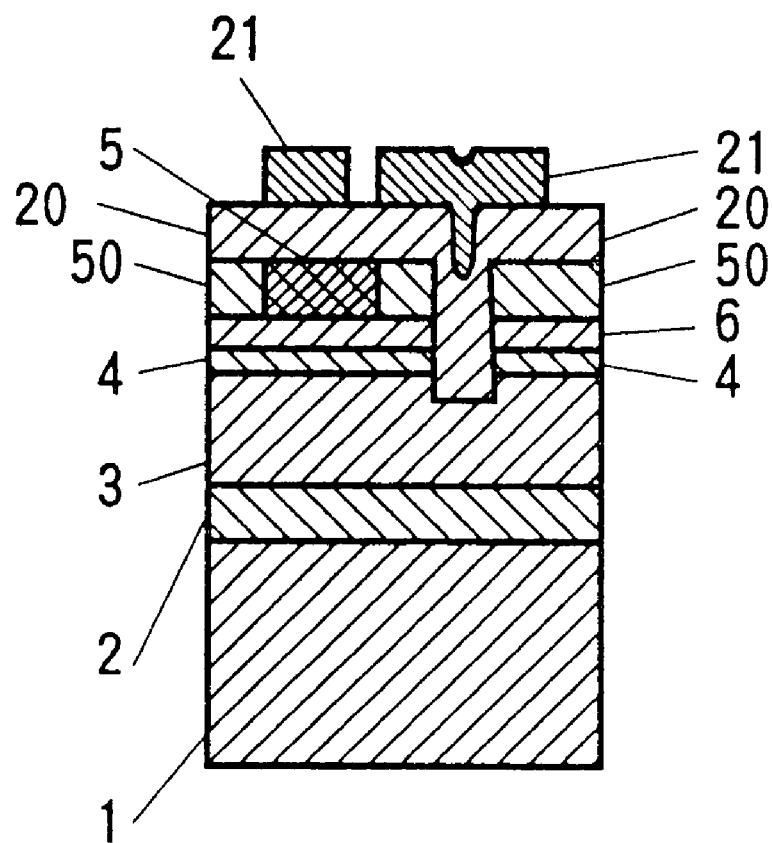

An Al-layer 20 was laminated on the surface of the P-type part 5, the I-layer 50, and the N$^+$-layer 3 of high carrier concentration through the hole 15 by vapor deposition as shown in FIG. 15. A photoresist layer 21 was laminated on the Al-layer 20. It was etched off by photolithography leaving patterns for two electrodes connected to the N$^+$-layer 3 of high carrier concentration and the P-type part 5, respectively. The exposed part of the Al layer 20 not covered by the photoresist 21 as a mask was etched off by an etching such as nitric acid. After the photoresist 21 was completely removed by acetone, two electrodes, the electrode 52 for the N$^+$-layer 3 of high carrier concentration and the electrode 51 for the P-layer 5 as shown in FIG. 8 were formed. The wafer treated with the above mentioned process then was divided into separate elements.

The LED 10 obtained thereby was found to have a luminous intensity of 10 mcd and wavelength of 460 to 470 mn. These results were as same as those in Example 1. In contrast to a conventional LED, the one in the present invention has its spectrum shifted by 20 to 50 nm to the long end and emits blue light.

EXAMPLE 3

The LED 10 in Example 3 changes the formula of respective four layers, an N$^+$-layer 3 of high carrier concentrations and N-layer 4 of low carrier concentrations an I-layer 6 and a P-layer 5, into Al$_{0.2}$Ga$_{0.5}$In$_{0.3}$N. The N$^+$-layer 3 of high carrier concentration was formed to have an electron concentration of 2×10$^{18}$/cm$^3$ doped with silicon impurities. The N-layer 4 of low carrier concentration was formed to have an electron concentration of 1×10$^{16}$/cm$^3$ without any impurities. The I-layer was formed to have Zn concentration of 3×10$^{20}$/m$^3$ and have a 400 Å thickness. The P-layer 5 was formed to have a hole concentration of 2×10$^{17}$/cm$^3$ doped with Mg and irradiated with electron rays. Two aluminum electrodes 7 and 8 were formed to have contacts to the P-layer 5 and the N$^+$-layer 3 respectively.

The LED 10 can be produced in the same manner as that in Example 1. Trimethyl indium (In(CH$_3$)$_3$) was used as one of the gases for the process additionally to TMG, TMA, silane and CP$_2$Mg. The growth temperature and the flow rate of gases in the process were as same as that in Example 1. Trimethyl indium was fed at a flow rate of 1.7×10$^{-4}$ mol/min.

A P-type conductive semiconductor was obtained by the uniform irradiation of electron rays on the P-layer 5 using a reflective electron beam diffraction device as employed in Example 1.

The LED 10 obtained thereby was found to have 10 mcd of luminous intensity and a 460 to 480 nm wavelength. Compared to a conventional LED, the one in the present invention has its spectrum shifted toward the long end by 20 to 60 nm and can emit blue light.

What is claimed is:

1. A light-emitting semiconductor device comprising:
   an N-layer of N-type conduction of group III nitride compound semiconductor satisfying the formula Al$_{X1}$Ga$_{Y1}$In$_{1-X1-Y1}$N, where $0 \leq X1 \leq 1$, $0 \leq Y1 \leq 1$, and $0 \leq X1+Y1 \leq 1$, said N-layer being doped with Si;

a P-layer of P-type conduction of group III nitride compound semiconductor satisfying the formula Al$_{X2}$Ga$_{Y2}$In$_{1-X2-Y2}$N, where $0 \leq X2 \leq 1$, $0 \leq Y2 \leq 1$, and $0 \leq X2+Y2 \leq 1$, said P-layer being doped with Mg impurites; and a Zn-doped layer as an emission layer of group III nitride compound semiconductor satisfying the formula Al$_{X3}$Ga$_{Y3}$In$_{1-X3-Y3}$N, where $0 \leq X3 \leq 1$, $0 \leq Y3 \leq 1$, and $0 \leq X3+Y3 \leq 1$, said Zn-doped layer being doped with Zn impurities in a concentration in the range of 1×10$^{19}$/cm$^3$ to 1×10$^{21}$/cm$^3$, having a thickness in the range of 20 to 400 Å and being formed between said N-layer and said P-layer and contacting said N-layer and said P-layer.

2. The light-emitting semiconductor device of claim 1 further comprising:
   an N$^+$-layer of N-type conduction of group III nitride compound semiconductor satisfying the formula Al$_{X4}$Ga$_{Y4}$In$_{1-X4-Y4}$N, where $0 \leq X4 \leq 1$, $0 \leq Y4 \leq 1$, and $0 \leq X4+Y4 \leq 1$, said N$^+$-layer contacting said N-layer on a surface opposite a surface contacting said Zn-doped layer;

a buffer layer contacting said N$^+$-layer on a surface opposite said N-layer;

a sapphire substrate contacting said buffer layer on a surface opposite said N$^+$-layer; and first and second electrodes electrically insulated from one another and contacting said P-layer and said N$^+$-layer, respectively.

3. The light-emitting semiconductor device of claim 1, wherein X3≈0.2 and Y3≈0.3.

4. The light-emitting semiconductor device of claim 1, wherein:

said P-layer of P-type conduction is formed by changing a part of a Mg-doped semi-insulating I-layer of group III nitride compound semiconductor satisfying the formula $Al_{X2}Ga_{Y2}In_{1-X2-Y2}N$, where $0 \leq X2 \leq 1$, $0 \leq Y2 \leq 1$, and $0 \leq X2+Y2 \leq 1$, P-type conductive.

5. The light-emitting semiconductor device of claim 4 further comprising:

an N$^+$-layer of N-type conduction of group III nitride compound semiconductor satisfying the formula $Al_{X4}Ga_{Y4}In_{1-X4-Y4}N$, where $0 \leq X4 \leq 1$, $0 \leq Y4 \leq 1$, and $0 \leq X4+Y4 \leq 1$, said N$^+$-layer on a surface opposite a surface contacting Zn-doped layer;

a buffer layer contacting said N$^+$-layer on a surface opposite said N-layer;

a sapphire substrate contacting said buffer layer on a surface opposite said N$^+$-layer; and first and second electrodes electrically insulated from one another and contacting said P-layer and said N$^+$-layer, respectively.

6. The light-emitting semiconductor device of claim 4, wherein said N-layer comprises a double layer structure comprising an N-layer having a relatively low impurity concentration and contacting said Zn-doped layer and an N$^+$-layer having a relatively high carrier concentration and contacting said N-layer.

7. The eight-emitting semiconductor device of claim 4, wherein said N-layer comprises a carrier concentration in the range of $1 \times 10^{14}/cm^3$ to $1 \times 10^{17}/cm^3$ and wherein said N$^+$-layer has a carrier concentration in the range of $1 \times 10^{17}/cm^3$ to $1 \times 10^{19}/cm^3$.

8. The light-emitting semiconductor device of claim 4, wherein said N-layer has a thickness in the range of 0.5 $\mu$m to 2.0 $\mu$m and wherein said N$^+$-layer has a thickness in the range of 2.0 $\mu$m to 10.0 $\mu$m.

9. The light-emitting semiconductor device of claim 1, wherein said N-layer comprises a double layer structure comprising an N-layer having a relatively low impurity concentration and contacting said Zn-doped layer and an N$^+$-layer having a relatively high carrier concentration and contacting said N-layer.

10. The light-emitting semiconductor device of claim 9, wherein said N-layer comprises a carrier concentration in the range of $1 \times 10^{14}/cm^3$ to $1 \times 10^{17}/cm^3$ and wherein said N$^+$-layer has a carrier concentration in the range of $1 \times 10^{17}/cm^3$ to $1 \times 10^{19}/cm^3$.

11. The light-emitting semiconductor device of claim 9, wherein said N-layer has a thickness in the range of 0.5 $\mu$m to 2.0 $\mu$m and wherein said N$^+$-layer has a thickness in the range of 2.0 $\mu$m to 10.0 $\mu$m.

* * * * *